United States Patent
Onishi

(10) Patent No.: US 8,451,029 B2
(45) Date of Patent: May 28, 2013

(54) FREQUENCY SYNTHESIZER

(75) Inventor: Naoki Onishi, Chitose (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 490 days.

(21) Appl. No.: 12/805,436

(22) Filed: Jul. 30, 2010

(65) Prior Publication Data

US 2011/0032005 A1 Feb. 10, 2011

(30) Foreign Application Priority Data

Aug. 7, 2009 (JP) .............................. P2009-184126

(51) Int. Cl.
*H03B 21/00* (2006.01)

(52) U.S. Cl.
USPC .......................................................... 327/105

(58) Field of Classification Search
USPC .......................................................... 327/105
See application file for complete search history.

(56) References Cited

U.S. PATENT DOCUMENTS 3,898,579 A * 8/1975 Aldridge .................... 331/1 A

FOREIGN PATENT DOCUMENTS

| JP | S50-107040 | 9/1975 |
|---|---|---|
| JP | S53-146560 | 12/1978 |
| JP | S59-194519 | 11/1984 |
| JP | 63-036675 | 2/1988 |
| JP | 02-214222 | 8/1990 |
| JP | 06-260932 | 9/1994 |
| JP | 08-05612 | 2/1996 |
| JP | 08-056120 | 2/1996 |
| JP | 08-317564 | 11/1996 |
| JP | 2002-135235 | 5/2002 |
| JP | 2004-172686 | 6/2004 |
| JP | 2005-043289 | 2/2005 |

* cited by examiner

*Primary Examiner* — Daniel Rojas
(74) *Attorney, Agent, or Firm* — Jacobson Holman PLLC

(57) ABSTRACT

A frequency synthesizer in which a satisfactory frequency stability can be obtained over the entire long period of service immediately after power activation is disclosed. The reference signal generation circuit includes an OCXO, a TCXO, weight converters which regulate weights with respect to outputs, and an adder which adds up the outputs from the weight converters to output the added output as a reference signal. The CPU controls weight converters B and C so that the weight of the TCXO is set to 100% and the weight of the OCXO is set to 0% at the time of the power activation, so that the weight of the OCXO gradually rises, and so that the weight of the TCXO is set to 0% and the weight of the OCXO is set to 100% after preset time, whereby the frequency can quickly be stabilized after the power activation.

8 Claims, 5 Drawing Sheets

| TIME | OCXO | TCXO |
|---|---|---|
| 0 | 0 (%) | 100 (%) |
| ⋮ | ⋮ | ⋮ |
| $\frac{T_1}{4}$ | 12.5 | 87.5 |
| ⋮ | ⋮ | ⋮ |
| $\frac{T_1}{2}$ | 25 | 75 |
| ⋮ | ⋮ | ⋮ |
| $T_1 \sim$ | 100 | 0 |

FIG.4

| TIME | EXTERNAL | OXCO+TCXO |
|---|---|---|
| 0 | 0 (%) | 100 (%) |
| ⋮ | ⋮ | ⋮ |
| $\frac{T4}{2}$ | 50 | 50 |
| ⋮ | ⋮ | ⋮ |
| T4 ~ | 100 | 0 |

FREQUENCY SYNTHESIZER

This application has a priority of Japanese no. 2009-184126 filed Aug. 7, 2009, hereby incorporated by reference.

BACKGROUND OF THE INVENTION

1. Field of the Invention

The present invention relates to a frequency synthesizer, and more particularly, it relates to a frequency synthesizer in which a reference signal to be internally used can be stabilized over the entire period of service immediately after power activation.

2. Description of the Related Art

In a frequency synthesizer used in a base station of the next generation mobile communication, ground digital broadcasting or the like, the improvement of accuracy with respect to a reference signal or the improvement of start characteristics has been desired.

Examples of a reference signal source include a cesium (Cs) standard oscillator, a rubidium (Rb) standard oscillator, a frequency synchronous type standard oscillator by GPS signal, an oven controlled crystal oscillator (OCXO) and a temperature compensated crystal oscillator (TCXO), and these sources have different frequency accuracies.

Therefore, the reference signal source which satisfies an accuracy necessary for each use application is utilized.

The OCXO is a crystal oscillator comprising a constant temperature oven which maintains a temperature, and the TCXO is a crystal oscillator which beforehand stores, in a memory, temperature compensation data to compensate for fluctuations due to a temperature, thereby correcting the temperature.

[Target of Frequency Stability of Oscillator: FIG. 6]

The frequency stabilities of oscillators used as reference signal sources will be described with reference to FIG. 6. FIG. 6 is a schematic explanatory view showing the frequency stabilities of the oscillators used as the reference signal sources.

As shown in FIG. 6, in general, the TCXO has a frequency stability ($\Delta f/f$) of about $10^{-6}$, the OCXO has a frequency stability of about $10^{-8}$, and the rubidium oscillator and cesium oscillator utilizing the resonance phenomenon of atoms satisfactorily have frequency stabilities of about $10^{-10}$ and $10^{-12}$, respectively.

However, the rubidium oscillator and cesium oscillator are expensive, and hence it is not realistic to mount the oscillators in mass products.

Moreover, the frequency of the OCXO noticeably fluctuates for several minutes until the temperature of the constant temperature oven reaches a fixed temperature. The TCXO only requires a short time until it stabilizes, and hence, has satisfactory rising characteristics, but the frequency stability of the oscillator for a long period of time is poor as compared with the OCXO.

On the other hand, it is known that the phase noise characteristics of the OCXO are more satisfactory than those of the TCXO.

RELATED ART

It is to be noted that examples of a technology concerning the frequency synthesizer include Japanese Patent Application Laid-Open No. 8-56120 titled 'Reference Oscillator Circuit' (applicant: Yaesu Musen Co., Ltd., Patent Document 1) and Japanese Patent Application Laid-Open No. 2004-172686 titled 'Reference Signal Generator' (applicant: NEC Engineering Ltd., Patent Document 2).

In Patent Document 1, the reference oscillator circuit is described which comprises both a TCXO and an OCXO, and switches the outputs of the oscillators to use the switched output as a reference signal in the frequency synthesizer.

Moreover, in Patent Document 2, the reference signal generator is described which comprises a voltage controlled type digital temperature compensated crystal oscillator (VC-DTCXO) and an OCXO, and switches the outputs of the oscillators to use the switched output as a reference signal.

However, in Patent Documents 1 and 2, there is not disclosed a constitution in which weights are applied to the outputs from a plurality of oscillators to synthesize the outputs or in which a reference signal having a higher stability is input from the outside.

SUMMARY OF THE INVENTION

However, in a conventional frequency synthesizer, when the output of an OCXO is used as a reference signal, stability is poor during rising. When a TCXO is used, the oscillator stabilizes early during the rising, but the stability for a long period of time is poor, thereby causing a problem that a satisfactory frequency stability cannot be obtained over the entire long period of service immediately after power activation.

The present invention has been developed in view of the above situation, and an object thereof is to provide a frequency synthesizer which can obtain a satisfactory frequency stability over the entire long period of service immediately after power activation.

To solve the above problems of the conventional examples, according to the present invention, there is provided a frequency synthesizer comprising: a reference signal generation circuit which generates a reference signal, the reference signal output from the reference signal generation circuit being compared with an output signal from a voltage controlled oscillator to perform control so that the output signal of the voltage controlled oscillator has a desirable frequency, wherein the reference signal generation circuit includes a first oscillator having such characteristics that a frequency thereof stabilizes shortly after power activation; a second oscillator having such characteristics that a frequency thereof is more unstable than that of the first oscillator immediately after the power activation and that the stability of the frequency thereof is higher than that of the first oscillator after the elapse of a fixed time; a first weight converter which regulates the weight of an output from the first oscillator; a second weight converter which regulates the weight of an output from the second oscillator; an adder which adds up outputs from the first and second weight converters to output the added output as the reference signal; and a control unit which controls a first weight of the first weight converter and a second weight of the second weight converter to output the values of the weights to the first and second weight converters so that the first weight is set to be higher than the second weight and the second weight is set to be lower than the first weight immediately after the power activation, so that the first weight lowers and the second weight rises gradually with the elapse of time, and so that the first weight is set to be 0% and the second weight is set to be 100% after the elapse of a fixed time. In consequence, immediately after the power activation, the contribution of the first oscillator is increased to shortly stabilize the frequency. Moreover, phase noise characteristics during rising can be improved by the contribution of the second oscillator as compared with a case where the first oscillator is used alone. Furthermore, after the elapse of the fixed time when the second oscillator stabilizes, the only second oscillator is utilized, thereby producing an effect that it is possible to supply the stable reference signal over the entire long period of service immediately after the power activation.

Moreover, in the present invention, the above frequency synthesizer further comprises a third weight converter which is configured to input an external reference signal having a stability higher than the stabilities of the first and second oscillators and which regulates the weight of the external reference signal, wherein the adder adds up outputs from the first, second and third weight converters to output the added output as the reference signal, and when the external reference signal is input, the control unit outputs the values of the weights to the first and second weight converters so that the first weight of the first weight converter and the second weight of the second weight converter are set to 0%, and the control unit outputs the value of the weight to the third weight converter so that a third weight of the third weight converter is set to 100%. When the external reference signal is input, the external reference signal having a high stability is most preferentially output, thereby producing effects that the highly stable reference signal can be supplied and that a loop can quickly converge.

Furthermore, according to the present invention, in the above frequency synthesizer, when the external reference signal is input, the control unit outputs the value of the weight to the third weight converter so that the third weight of the third weight converter gradually increases from 0% to 100% within a preset transition period, and the control unit outputs the values of the weights to the first and second weight converters so that the sum of the first weight of the first weight converter and the second weight of the second weight converter gradually decreases from 100% to 0% within the transition period, thereby producing an effect that the frequency of the reference signal can be prevented from rapidly fluctuating before the loop stabilizes, to prevent the output of the frequency synthesizer from becoming unstable.

In addition, according to the present invention, the above frequency synthesizer further comprises a first table in which the first weight of the first weight converter and the second weight of the second weight converter are stored with respect to time from the power activation; and a second table in which the third weight of the third weight converter and the sum of the first and second weights are stored with respect to time from the start of the input of the external reference signal, wherein when any external reference signal is not input, the control unit outputs the values of the weights to the first and second weight converters based on the first table, and when the external reference signal is input, the control unit outputs the value of the weight to the third weight converter based on the second table, and distributes the sum of the first and second weights stored in the second table in accordance with a ratio between the first weight and the second weight stored in the first table to output the values of the weights to the first and second weight converters, thereby producing effects that the control unit can output the appropriate weight values to the first and second weight converters in accordance with the time from the power activation by simple processing and that the control unit can easily output the appropriate weight values to the first, second and third weight converters so that the frequency does not rapidly fluctuate, when the external reference signal is input.

Moreover, in the above frequency synthesizer, the first oscillator is a temperature compensated crystal oscillator and the second oscillator is an oven controlled crystal oscillator, thereby producing an effect that it is possible to comparatively inexpensively realize the frequency synthesizer having the high stability of the reference signal over the long period of time immediately after the power activation and having satisfactory phase noise characteristics.

BRIEF DESCRIPTION OF THE DRAWINGS

FIG. 4 is a schematic explanatory view of an external reference signal weight table;

DESCRIPTION OF REFERENCE NUMERALS

1 . . . reference signal generation circuit, 2 . . . phase comparator, 3 . . . loop filter, 4 . . . voltage controlled oscillator, 5 . . . divider, 10 . . . CPU, 20 . . . oven controlled crystal oscillator (OCXO), 30 . . . temperature compensated crystal oscillator (TCXO), 11, 21 and 31 . . . weight converters A, B and C, 12, 22 and 32 . . . D/A converter, 13 . . . external reference signal level detection circuit, 23 . . . oven temperature detection unit, 14 and 24 . . . A/D converter, 40 . . . memory, 41 . . . adder

DESCRIPTION OF THE PREFERRED EMBODIMENT

Outline of Embodiment

An embodiment of the present invention will be described with reference to the drawings.

A frequency synthesizer according to the embodiment of the present invention comprises, therein, an OCXO, a TCXO, weight converters which regulate the weights of outputs from the respective oscillators, an adder which adds up the outputs from the respective weight converters to output the added output as a reference signal to a PLL circuit, and a control unit which controls the respective weight converters. The control unit controls the respective weight converters so that the weight of the TCXO rises during power activation, so that the weight of the OCXO gradually increases, and so that the only OCXO is used after a constant temperature oven of the OCXO reaches a predetermined temperature. In consequence, the frequency of the reference signal during the power activation can quickly be stabilized, and the frequency can also be stabilized for a long period of time.

Moreover, in addition to the above constitution, the frequency synthesizer according to the embodiment of the present invention can input an external reference signal from an oscillator having a higher stability, and comprises a weight converter which regulates the output weight of the external reference signal. When the external reference signal is input, the control unit raises the weight of the external reference signal to preferentially output the signal. When the external reference signal is input during rising, the reference signal having a high accuracy can be output, and the PLL circuit can quickly be locked.

Figure 1:
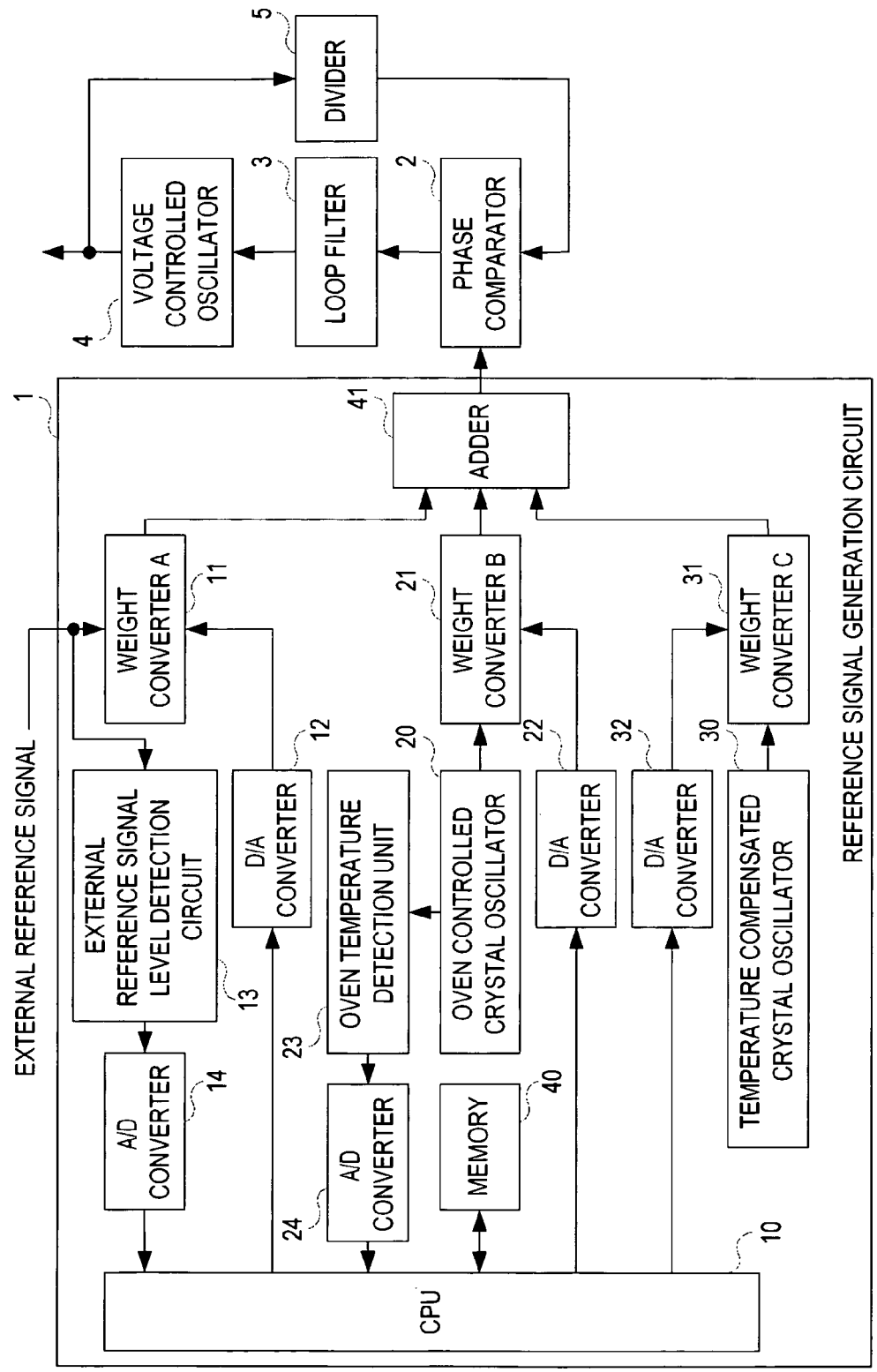
FIG. 1 is a constitution block diagram of a frequency synthesizer according to the present embodiment.

[Oscillator According to the Embodiment: FIG. 1]

A constitution of the frequency synthesizer according to the present embodiment will be described with reference to FIG. 1. FIG. 1 is a constitution block diagram of the frequency synthesizer according to the present embodiment (the present frequency synthesizer).

As shown in FIG. 1, the present frequency synthesizer is basically constituted of a reference signal generation circuit 1, a phase comparator 2, a loop filter 3, a voltage controlled oscillator 4 and a divider 5.

Moreover, the phase comparator 2 compares a reference signal output from the reference signal generation circuit 1 with a divided synthesizer output from the divider 5 to detect a phase difference, thereby outputting a phase difference signal, and the loop filter 3 smoothes the phase difference signal, and outputs a control voltage to the voltage controlled oscillator to output a predetermined frequency from the voltage controlled oscillator.

[Reference Signal Generation Circuit 1: FIG. 1]

Next, the reference signal generation circuit 1 which is the characteristic part of the present frequency synthesizer will be described with reference to FIG. 1.

The reference signal generation circuit 1 comprises, therein, an oven controlled crystal oscillator (OCXO) 20, and a temperature compensated crystal oscillator (TCXO) 30. Furthermore, the circuit can input an external reference signal input from the output by a user's operation, and regulates a weight ratio between the OCXO 20 and TCXO 30 and the external reference signal to add up these outputs, thereby outputting a reference signal. The OCXO 20 corresponds to a second oscillator described in claims, and the TCXO 30 corresponds to a first oscillator.

It is to be noted that the internally provided first and second oscillators are not limited to the TCXO and the OCXO, and there is not any special restriction on a combination of the oscillators, as long as the first oscillator has such characteristics that a frequency deviation ($\Delta f/f$) quickly stabilizes after power activation and the second oscillator has such characteristics that the stabilization requires time as compared with the first oscillator, but the frequency stability of the second oscillator is higher than that of the first oscillator after the elapse of a fixed time after the power activation.

Here, the external reference signal is output from, for example, a rubidium oscillator or a cesium oscillator, and is thus output from the oscillator having a stability higher than that of the internally provided OCXO 20 or TCXO 30.

Moreover, a signal source of the external reference signal may be a crystal oscillator as long as the oscillator has a stability higher than that of the internally provided OCXO 20 or TCXO 30.

The constitution of the reference signal generation circuit 1 will specifically be described.

As shown in FIG. 1, the reference signal generation circuit 1 comprises a CPU 10, the oven controlled crystal oscillator (OCXO) 20, the temperature compensated crystal oscillator (TCXO) 30, a weight converter A (11), a weight converter B (21), a weight converter C (31), D/A converters 12, 22 and 32, an external reference signal level detection circuit 13, A/D converters 14 and 24, an oven temperature detection unit 23, a memory 40 and an adder 41.

The constituent parts will be described.

The weight converter A (11) converts the weight of the external reference signal input from the outside based on a weight value from the CPU 10, to output the value to the adder 41.

The weight converter B (21) converts the weight of the output of the OCXO 20 based on the weight value from the CPU 10, to output the value to the adder 41.

The weight converter C (31) converts the weight of the output of the TCXO 30 based on the weight value from the CPU 10, to output the value to the adder 41.

The weight converters A, B and C correspond to third, second and first weight converters described in the claims, and the weight values of the weight converters A, B and C correspond to third, second and first weights described in the claims, respectively.

The adder 41 adds up the outputs from the weight converters A, B and C to output the added output as the reference signal to the phase comparator 2.

The CPU 10 corresponds to a control unit described in the claims, and outputs the weight values to control the weights of the weight converters A, B and C. In consequence, the present frequency synthesizer appropriately weighs and adds up the external reference signal and the outputs of the OCXO 20 and TCXO 30, thereby outputting the reference signal having a high frequency stability and excellent phase noise characteristics. The processing of the CPU 10 will specifically be described later.

The D/A converters 12, 22 and 32 convert the weight values from the CPU 10 into analog signals to output the signals to the weight converters A, B and C, respectively.

The external reference signal level detection circuit 13 detects the (analog) input level of the external reference signal. It is to be noted that the external reference signal is input or is not input depending on the frequency stability required for a system, and the input is switched on/off manually with a switch or the like by the user.

The A/D converter 14 converts the input level of the analog signal into a digital input level.

Moreover, the CPU 10 judges that the external reference signal is input, when the level of the external reference signal from the A/D converter 14 is a fixed level or more.

The oven temperature detection unit 23 detects the temperature of the constant temperature oven of the OCXO 20 to output an analog temperature signal to the A/D converter 24.

The A/D converter 24 converts the analog temperature signal into digital temperature data.

In the memory 40, two types of weight tables, i.e., a basic weight table which is the reference of the weight control in the CPU 10 and an external reference signal weight table are stored. The weight tables will be described later.

In the present frequency synthesizer, the basic weight table is prepared based on a relation between the time elapsed from the power activation and the frequency stabilities of the OCXO 20 and TCXO 30 beforehand obtained by simulation or experiment, and the table is beforehand stored in the memory 40.

Moreover, an application example of the weight control utilizing the oven temperature detection unit 23 will be described later.

Figures 2, 3:
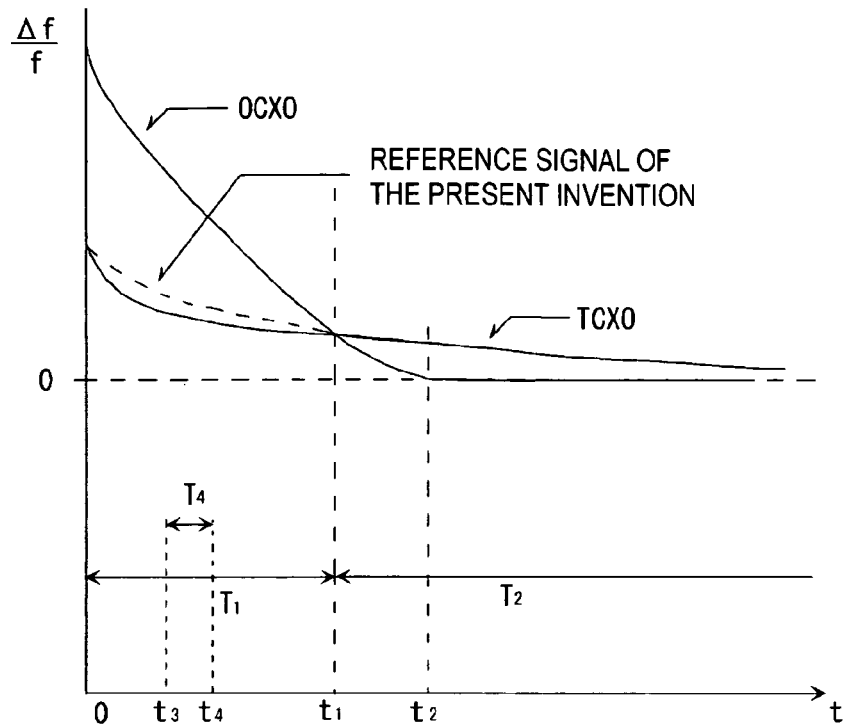
FIG. 2 is a schematic explanatory view showing the characteristics of the frequency stabilities of an OCXO and a TCXO.
FIG. 3 is a schematic explanatory view of a basic weight table.

[Stabilities of OCXO and TCXO: FIG. 2]

Next, the characteristics of the frequency stabilities of the OCXO and TCXO used in the present frequency synthesizer will be described with reference to FIG. 2. FIG. 2 is a schematic explanatory view showing the characteristics of the frequency stabilities of the OCXO and TCXO.

As shown in FIG. 2, the time of the power activation is 0. In this case, the frequency stability ($\Delta f/f$) of the OCXO is not satisfactory for a while after the power activation. At time t2, the temperature of the constant temperature oven sufficiently rises to reach a fixed temperature, and accordingly, the frequency stability becomes satisfactory. It is to be noted that in an example show in the present schematic diagram, a target frequency stability (Δf/f) is shown as 0, and all the stabilities are shown on a plus side (the OCXO or TCXO has characteristics which actually start from a minus side, depending on the type of the oscillator). The TCXO stabilizes shortly after the power activation, but becomes more unstable than the OCXO at and after time t1.

To solve the problem, in the present frequency synthesizer, the weight converters B and C are controlled so that the weight of the TCXO is set to 100% immediately after the power activation, the frequency of the reference signal is quickly stabilized during rising, the weight of the TCXO is gradually decreased to increase the weight of the OCXO, and the weight of the OCXO is set to 100%, when the stability of the OCXO substantially exceeds that of the TCXO.

That is, in an interval T1 between the power activation and the time t1, the weight of the TCXO is gradually decreased from 100%, and the weight of the OCXO is gradually increased from 0% to 100%. In an interval T2 (after the time t1), the weight of the OCXO is set to 100% as it is. In consequence, the reference signal of the frequency synthesizer of the present embodiment is obtained as shown by a dotted line.

In the present frequency synthesizer, the weight control with the elapse of time is performed based on the basic weight table described later until T1 elapses after the power activation.

Thus, in the interval T1, the TCXO and the OCXO are used together while the weight regulation is performed. In consequence, the contribution of the TCXO is increased to improve the frequency stability until the OCXO sufficiently stabilizes, whereby the phase noise characteristics can be improved by the contribution of the OCXO as compared with a case where the TCXO is used alone.

Moreover, in the present frequency synthesizer, when the frequency stability is not satisfactory in the interval T1 or a loop is to be converged early, the external reference signal can be input in accordance with an instruction from the user (manual connection with respect to the external reference signal source).

When the external reference signal is input, the weight of the external reference signal is set to 100%, and the weight of each of the OCXO and TCXO is set to 0%.

It is to be noted that to prevent the rapid fluctuation of a reference frequency due to the input of the external reference signal, a period from the start of the input of the external reference signal to the elapse of fixed short time is regarded as a transition period, and the weight converters A, B and C are controlled so that the weight of the external reference signal gradually increases. Here, the short time is T4. The weight control in the interval T4 is performed based on the external reference signal weight table described later.

In the example of FIG. 2, when the external reference signal starts to be input at time t3, the weight of the external reference signal is gradually changed from 0% to 100% in the interval T4 until time t4. After the interval T4, the weight of the external reference signal is set to 100%.

Subsequently, when the input of the external reference signal is cut in accordance with the instruction from the user (manual disconnection from the external reference signal source), the CPU 10 performs the weight control with reference to the basic weight table in accordance with the time from the power activation.

[Operation in a Case where any External Reference Signal is not Input: FIGS. 1 and 2]

After the power activation, the CPU 10 starts measuring time, and periodically judges whether or not the external reference signal is input, based on the external reference signal level from the A/D converter 14. When any external reference signal is not input, the CPU periodically outputs the weight value of the OCXO to the D/A converter 22 and outputs the weight value of the TCXO to the D/A converter 32 with reference to the basic weight table.

The weight values are D/A converted and input into the weight converters B and C, respectively, and the outputs of the OCXO 20 and TCXO 30 are weight-converted, and input into the adder 41 with a weight ratio set in the basic weight table. The outputs are added up, and the added output is output as the reference signal.

[Operation in a Case where the External Reference Signal is Input: FIGS. 1 and 2]

When the CPU 10 recognizes the input of the external reference signal based on the external reference signal level from the A/D converter 14, the CPU gradually increases the weight of the external reference signal. After the interval T4 which is the transition period, the CPU outputs the weight values to the D/A converters 12, 22 and 32 so that the weight of each of the OCXO and the TCXO is set to 0% and the weight of the external reference signal is set to 100%.

The external reference signal has the highest stability. Therefore, when the external reference signal is input, this signal is most preferentially used to quickly stabilize the reference frequency and synthesizer output. The weight control in the interval T4 will be described later.

It is to be noted that the input/cut of the external reference signal is performed by the user's operation, and the frequency is still unstable during the input of the external reference signal. Therefore, special weight control is performed in the interval T4 which is the transition period. After the convergence of the loop due to the input of the external reference signal, however, even if the external reference signal is cut, thereby shifting to a combination of the OCXO 20 and TCXO 30 (or to the OCXO 20 only), the frequency does not noticeably fluctuate.

[Basic Weight Table: FIG. 3]

Next, among the weight tables stored in the memory 40, the basic weight table will be described with reference to FIG. 3. FIG. 3 is a schematic explanatory view of the basic weight table. It is to be noted that the basic weight table corresponds to a first table described in the claims.

The basic weight table serves as the reference of the weight control, and there are stored the weight values of the weight converter B (21) via which the CPU 10 regulates the weight of the OCXO 20 and the weight converter C (31) via which the CPU regulates the weight of the TCXO 30. Moreover, the numeric values of the basic weight table are determined for a case where the temperature of the OCXO 20 rises in accordance with standard temperature transition. When the time for the stabilization of the OCXO is long, T1 lengthens.

As shown in FIG. 3, in the basic weight table, the time from the power activation and the weight values of the OCXO 20 (the weight converter B) and the TCXO 30 (the weight converter C) are stored.

During the power activation, the weight of the OCXO is 0% and that of the TCXO is 100% as described above, and in the interval T1, the weight of the OCXO is 100% and that of the TCXO is 0%. During this interval, the weights are gradually changed.

The weight control is performed with the elapse of time basically in the interval T1 after the power activation. After T1, the OCXO stabilizes. Therefore, the weight of the OCXO is unchanged after the elapse of T1, i.e., 100%.

[External Reference Signal Weight Table: FIG. 4]

Next, the external reference signal weight table stored in the memory 40 will be described with reference to FIG. 4. FIG. 4 is a schematic explanatory view of the external reference signal weight table. It is to be noted that the external reference signal weight table corresponds to a second table described in the claims.

The external reference signal weight table serves as the reference of the weight control in the interval T4 which is the transition period in the case where the external reference signal is input.

It is to be noted that the transition period T4 is determined by a time to perform frequency synchronization by the synthesizer (the time when the PLL loop converges, in addition to a relation between the frequency stability of the external reference signal and the frequency stabilities of the TCXO and OCXO.

As shown in FIG. 4, in the external reference signal weight table, the weight of the external reference signal (the weight converter A) from the detection of the input of the external reference signal to the elapse of the time T4 and the sum of the weights of the OCXO and TCXO are stored, respectively.

In the example of FIG. 4, when the input of the external reference signal is detected (the time 0), the weight of the external reference signal is set to 0% and the weight of OCXO+TCXO is set to 100%. The weight is changed in proportion to the time until T4 elapses, and the ratio of the external reference signal is gradually increased. After T4, the weight of the external reference signal is set to 100%, and the weight of OCXO+TCXO is set to 0%.

In consequence, when the external reference signal is input, the output can gradually be switched to the external reference signal, and the rapid fluctuation of the reference frequency can be prevented from being generated. Moreover, after the shift to the external reference signal, the external reference signal preferentially continues to be output as the reference signal until the signal is cut by the user, whereby the synthesizer output can quickly be stabilized.

The weight control in the interval T4 will specifically be described.

For example, with the elapse of T4/2 from the detection of the input of the external reference signal, the weights of the external reference signal and OCXO+TCXO are both 50%. That is, at this time, the weight of the external reference signal is 50%, and the sum of the weights of the OCXO and TCXO is 50%. At this time, the weights of the OCXO and TCXO are distributed with a weight ratio set in the basic weight table shown in FIG. 3 based on the time elapsed from the power activation.

That is, until the elapse of T4 after the input of the external reference signal, each of the weights of the OCXO and TCXO is obtained by multiplying the weight value of the external reference signal weight table by the weight value of the basic weight table.

For example, when the input of the external reference signal starts early and T4/2 elapses from the detection of the input of the external reference signal, T1/4 elapses after the power activation. In this case, the weight of the OCXO is 0.5×0.125×100=6.25%, and the weight of the TCXO is 0.5× 0.875×100=43.75%.

Moreover, when the input of the external reference signal starts most slowly and T4/2 elapses from the detection of the input of the external reference signal, T1/2 elapses after the power activation. In this case, the weight of the OCXO is 0.5×0.25×100=12.5%, and the weight of the TCXO is 0.5× 0.75×100=37.5%.

In either case, the sum of the weights of the OCXO and TCXO is 50%.

Furthermore, when the input of the external reference signal is cut, the CPU 10 again refers to the basic weight table of FIG. 3, and controls the weights of the OCXO and TCXO in accordance with the weight value of that time (the time from the power activation).

Figure 5:
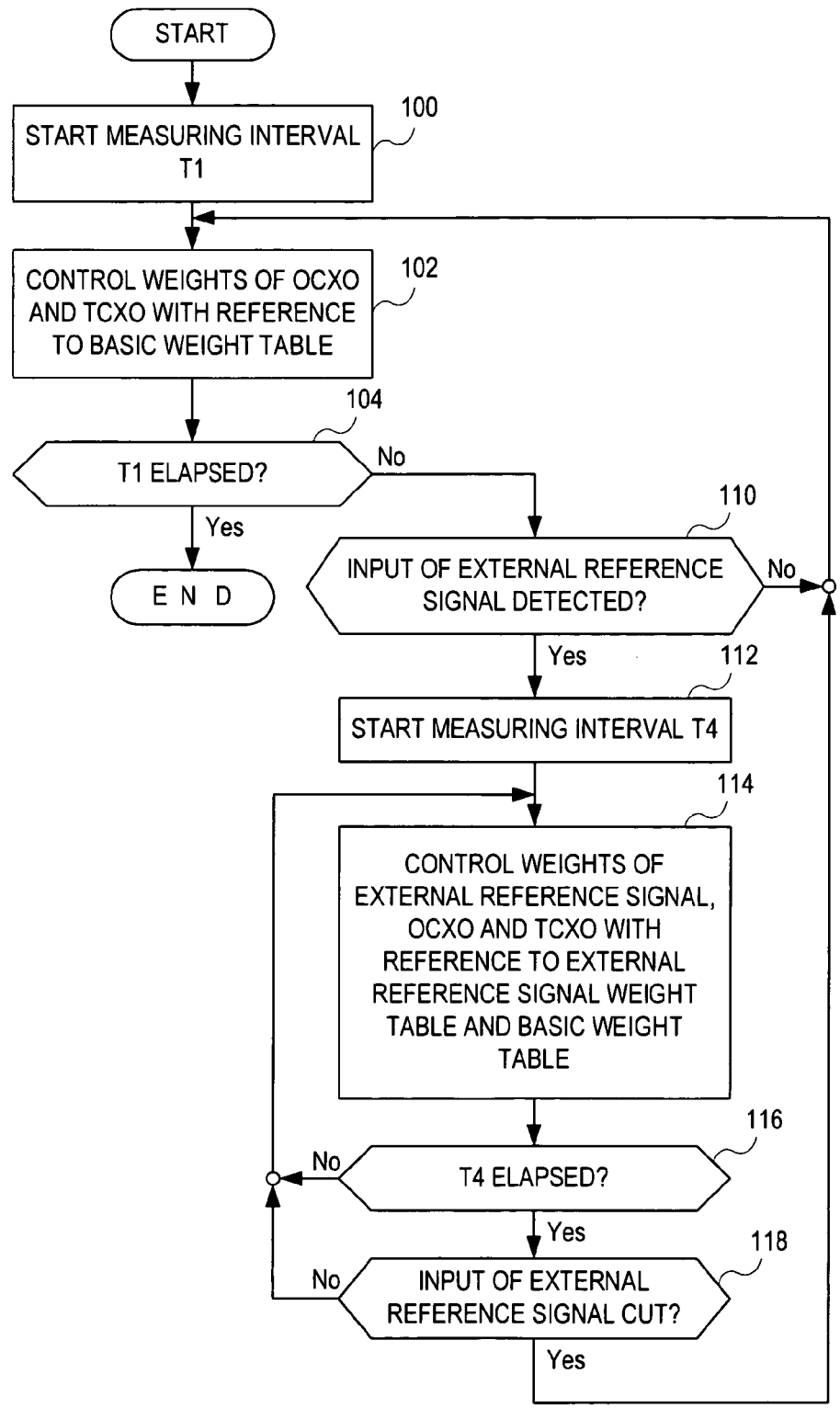
FIG. 5 is a flow chart showing the processing of weight control during power activation in a CPU 10.
Figure 6:
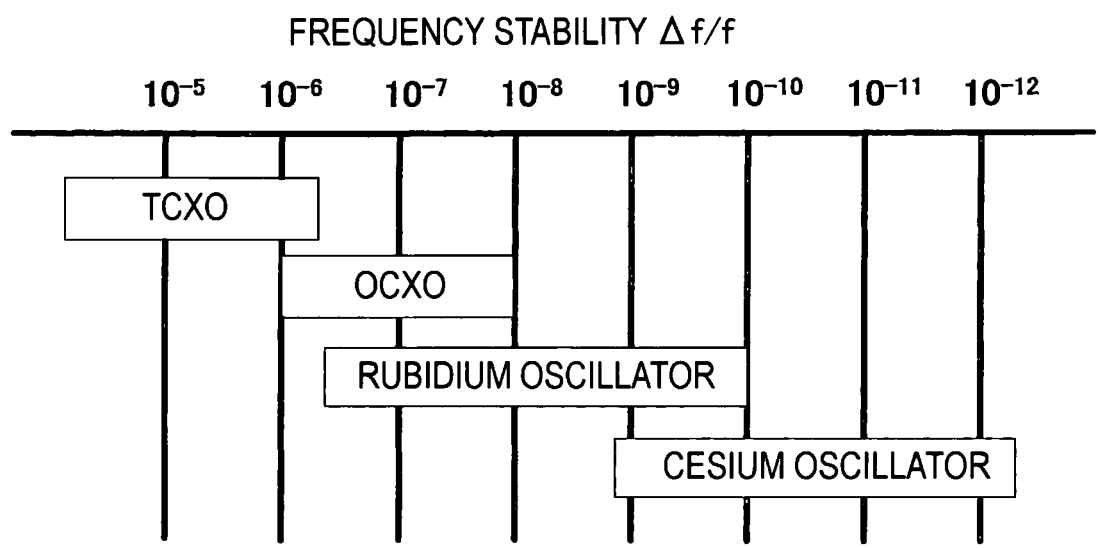
FIG. 6 is a schematic explanatory view showing the frequency stabilities of oscillators used as reference signal sources.

[Processing of Weight Control During Power Activation: FIG. 5]

Next, the processing of the weight control during the power activation in the CPU 10 will be described with reference to FIG. 5. FIG. 5 is a flow chart showing the processing of the weight control during the power activation in the CPU 10.

As shown in FIG. 5, when the power is activated, the CPU 10 starts measuring T1 (100), and controls the weights of the OCXO 20 and TCXO 30 with reference to the basic weight table (102).

Subsequently, the CPU 10 judges whether or not T1 has elapsed. When T1 elapses (in the case of Yes), the weights at that time (the weight of the OCXO is 100% and that of the TCXO is 0%) are held, thereby ending the processing.

Moreover, when T1 has not elapsed in processing 104 (in the case of No), the CPU 10 judges whether or not the input of the external reference signal is detected, based on the external reference signal level from the A/D converter 14 (110). When the input of the external reference signal is not detected (in the case of No), the processing shifts to the processing 102 to perform control based on the basic weight table.

Furthermore, when the input of the external reference signal is detected in processing 110 (in the case of Yes), the CPU 10 starts measuring the interval T4 (112), and controls the weights of the external reference signal and the OCXO and TCXO with reference to both the external reference signal weight table and the basic weight table (114).

Subsequently, the CPU 10 judges whether or not T4 has elapsed (116). When T4 has not elapsed (in the case of No), the processing shifts to the processing 114, thereby performing control so that the weight of the external reference signal gradually increases.

Moreover, when T4 has elapsed in the processing 116 (in the case of Yes), the weight of the external reference signal is 100% and the weight of each of the OCXO and TCXO is 0%. The CPU 10 judges whether or not the input of the external reference signal is cut (118). When the input is not cut (in the case of No), the processing shifts to the processing 114. That is, after the interval T4, the weight of the external reference signal is kept to be 100% as long as the input of the external reference signal continues.

When it is judged in processing 118 that the input of the external reference signal is cut (in the case of Yes), the CPU 10 shifts to the processing 102 to perform the control based on the basic weight table.

In this way, the processing of the weight control during the power activation in the CPU 10 is performed.

[Application Example of Weight Control]

Next, an application example of the weight control will be described.

In the application example, a CPU 10 finely regulates values of a basic weight table based on temperature information from an oven temperature detection unit 23 to control weights.

In the application example, a beforehand experimentally obtained standard relation between time from power activation and a constant temperature oven temperature (standard temperature transition) is beforehand stored in the memory 40. After the power activation, the CPU 10 compares the temperature information from the oven temperature detection unit 23 with the standard temperature transition. When the temperature of the constant temperature oven of an OCXO 20 rises earlier or more slowly as compared with the standard temperature transition, the CPU regulates the weight values of the basic weight table to output the values.

For example, in the basic weight table of FIG. 3, as to weights after the elapse of T2/2 from the power activation, the weight of the OCXO is 25%, and the weight of a TCXO is 75%. The CPU 10 outputs the values of the basic weight table as they are, when a difference between the temperature detected by the oven temperature detection unit 23 and a temperature (standard temperature) of that time in the standard temperature transition is in a fixed range.

Moreover, when the temperature during an operation rises early as compared with the standard temperature transition and the temperature detected by the oven temperature detection unit 23 is higher than the standard temperature, for example, the weight of the OCXO is set to 30% and the weight of the TCXO is set to 70%.

Conversely, it is considered that when the detected temperature is lower than the standard temperature, for example, the weight of the OCXO is set to 20% and the weight of the TCXO is set to 80%.

The weight values may be regulated in the CPU 10, for example, by calculating a coefficient corresponding to a difference between the temperature of the constant temperature oven and the standard temperature, and multiplying the weight value of the basic weight table by the coefficient to obtain the weight of the OCXO.

In this case, the weight of the OCXO can finely be regulated in accordance with the temperature state of the constant temperature oven. When the OCXO stabilizes early, the oscillator can be switched to the OCXO earlier. Moreover, when the temperature of the constant temperature oven of the OCXO rises slowly, the switching to the OCXO is delayed, whereby a stable reference signal can be output.

Effect of the Embodiment

According to the frequency synthesizer of the embodiment of the present invention, the reference signal generation circuit 1 comprises the OCXO 20, the TCXO 30, the weight converters 21 and 31 which regulate the weights with respect to the outputs, and the adder 41 which adds up the outputs from the weight converters to output the added output as the reference signal. The CPU 10 controls the weight converters B and C so that the weight of the TCXO 30 is set to 100% and the weight of the OCXO 20 is set to 0% during the power activation, so that the weight of the OCXO 20 gradually rises, and so that the weight of the TCXO 30 is set to 0% and the weight of the OCXO 20 is set to 100% after a preset time. Therefore, in the frequency synthesizer, the TCXO 30 and OCXO 20 can be used together to generate the reference signal until the constant temperature oven of the OCXO 20 is sufficiently heated, and the frequency can be stabilized early during the power activation. Moreover, there is another effect that after heating the constant temperature oven, the only OCXO 20 can be used to keep a satisfactory frequency stability over a long period of time.

Moreover, according to the present frequency synthesizer, the above constitution additionally comprises the weight converter A (11) through which the external reference signal having a higher stability can be input and which regulates the weight of the external reference signal, and the external reference signal level detection circuit 13 which detects the input level of the external reference signal. The CPU 10 controls the weight converters A, B and C so that when the external reference signal is input, the weight of the external reference signal is set to 100%, and the weight of each of the OCXO 20 and the TCXO 30 is set to 0%. The frequency synthesizer produces effects that when the highly accurate external reference signal is input, the external reference signal can preferentially be output as the reference signal, and during rising, the reference signal can quickly be stabilized to quickly converge the PLL loop.

Furthermore, according to the present frequency synthesizer, when the external reference signal is input, the CPU 10 does not immediately switch to the external reference signal, but performs such control as to gradually raise the weight of the external reference signal in the transition period T4, thereby setting the weight of the external reference signal to 100% after T4. In consequence, the rapid fluctuation of the frequency can effectively be prevented.

In addition, the CPU 10 may control a power source circuit so as to stop the supply of powers to the TCXO 30 and weight converter C (31), when the weight of the TCXO 30 becomes 0%. In consequence, power consumption can noticeably be decreased.

Moreover, according to the present frequency synthesizer, the CPU 10 compares the temperature information from the oven temperature detection unit 23 with the stored standard temperature. When a difference is larger than a fixed range and the temperature is higher than the standard temperature, the weight value of the OCXO is raised. When the temperature is lower than the standard temperature, the weight of the OCXO is lowered. Since the values of the basic weight table are regulated and output in this manner, the weight of the OCXO can finely be regulated in accordance with the temperature state of the constant temperature oven, and a further stable reference signal can be output.

The present invention is suitable for the frequency synthesizer which can stabilize the reference signal over the entire period of service immediately after the power activation.

What is claimed is:

1. A frequency synthesizer comprising: a reference signal generation circuit which generates a reference signal, the reference signal output from the reference signal generation circuit being compared with an output signal from a voltage controlled oscillator to perform control so that the output signal of the voltage controlled oscillator has a desirable frequency,
wherein the reference signal generation circuit includes:
a first oscillator having such characteristics that a frequency thereof stabilizes shortly after power activation;
a second oscillator having such characteristics that a frequency thereof is more unstable than that of the first oscillator immediately after the power activation and that the stability of the frequency thereof is higher than that of the first oscillator after the elapse of a fixed time;
a first weight converter which regulates the weight of an output from the first oscillator;
a second weight converter which regulates the weight of an output from the second oscillator;
an adder which adds up outputs from the first and second weight converters to output the added output as the reference signal; and
a control unit which controls a first weight of the first weight converter and a second weight of the second weight converter to output the values of the weights to the first and second weight converters so that the first weight is set to be higher than the second weight and the second weight is set to be lower than the first weight immediately after the power activation, so that the first weight lowers and the second weight rises gradually with the elapse of time, and so that the first weight is set to be 0% and the second weight is set to be 100% after the elapse of a fixed time.

2. The frequency synthesizer according to claim 1, further comprising:
   a third weight converter which is configured to input an external reference signal having a stability higher than the stabilities of the first and second oscillators and which regulates the weight of the external reference signal,
   wherein the adder adds up outputs from the first, second and third weight converters to output the added output as the reference signal, and
   when the external reference signal is input, the control unit outputs the values of the weights to the first and second weight converters so that the first weight of the first weight converter and the second weight of the second weight converter are set to 0%, and the control unit outputs the value of the weight to the third weight converter so that a third weight of the third weight converter is set to 100%.

3. The frequency synthesizer according to claim 2, wherein when the external reference signal is input, the control unit outputs the value of the weight to the third weight converter so that the third weight of the third weight converter gradually increases from 0% to 100% within a preset transition period, and the control unit outputs the values of the weights to the first and second weight converters so that the sum of the first weight of the first weight converter and the second weight of the second weight converter gradually decreases from 100% to 0% within the transition period.

4. The frequency synthesizer according to claim 3, further comprising:
   a first table in which the first weight of the first weight converter and the second weight of the second weight converter are stored with respect to time from the power activation; and
   a second table in which the third weight of the third weight converter and the sum of the first and second weights are stored with respect to time from the start of the input of the external reference signal,
   wherein when any external reference signal is not input, the control unit outputs the values of the weights to the first and second weight converters based on the first table, and when the external reference signal is input, the control unit outputs the value of the weight to the third weight converter based on the second table, and distributes the sum of the first and second weights stored in the second table in accordance with a ratio between the first weight and the second weight stored in the first table to output the values of the weights to the first and second weight converters.

5. The frequency synthesizer according to claim 1, wherein the first oscillator is a temperature compensated crystal oscillator and the second oscillator is an oven controlled crystal oscillator.

6. The frequency synthesizer according to claim 2, wherein the first oscillator is a temperature compensated crystal oscillator and the second oscillator is an oven controlled crystal oscillator.

7. The frequency synthesizer according to claim 3, wherein the first oscillator is a temperature compensated crystal oscillator and the second oscillator is an oven controlled crystal oscillator.

8. The frequency synthesizer according to claim 4, wherein the first oscillator is a temperature compensated crystal oscillator and the second oscillator is an oven controlled crystal oscillator.

* * * * *